(12) United States Patent
Chen et al.

(10) Patent No.: US 8,410,494 B2
(45) Date of Patent: Apr. 2, 2013

(54) LIGHT EMITTING DIODE PACKAGE AND LAMP WITH THE SAME

(75) Inventors: Ying-Chia Chen, Qionglin Township, Hsinchu County (TW); Hui-Hua Lien, Qionglin Township, Hsinchu County (TW)

(73) Assignee: Ying-Chia Chen, Qionglin Township, Hsinchu County (TW)

( * ) Notice: Subject to any disclaimer, the term of this patent is extended or adjusted under 35 U.S.C. 154(b) by 498 days.

(21) Appl. No.: 12/793,297

(22) Filed: Jun. 3, 2010

(65) Prior Publication Data

US 2011/0227481 A1   Sep. 22, 2011

(30) Foreign Application Priority Data

Mar. 16, 2010 (TW) ............................... 99107607 A

(51) Int. Cl.
*H01L 33/00* (2010.01)

(52) U.S. Cl. ............... 257/88; 257/89; 257/79; 257/99; 257/100

(58) Field of Classification Search .................. 362/362, 362/227, 257, 296, 301, 310, 311, 330, 329, 362/366–368, 375, 374; 257/99, 100, 103, 257/88, 89, 79
See application file for complete search history.

(56) References Cited

U.S. PATENT DOCUMENTS

| 8,106,406 B2 * | 1/2012 | Liu et al. .......................... 257/81 |
| 2011/0037082 A1 * | 2/2011 | Doan et al. ...................... 257/89 |

* cited by examiner

*Primary Examiner* — Tuyet Thi Vo
(74) *Attorney, Agent, or Firm* — Muncy, Geissler, Olds & Lowe, PLLC

(57) ABSTRACT

An LED package comprises a substrate, a constant current die, an LED die and an encapsulation body. The substrate has a plurality of internal conductive contacts and a plurality of external conductive contacts. The constant current die is electrically connected to the internal conductive contact, and comprises a constant current circuit and a protection circuit in parallel, wherein the constant current circuit allows a first current to flow through and the protection circuit allows a second current, in an opposite direction to the first current, to flow through. The LED die is electrically connected to the internal conductive contact. The encapsulation body encapsulates the constant current die, the LED die and the internal conductive contacts of the substrate. Having a small volume, the LED package can be applied to a compact lamp and prevents the LED from being damaged. An LED lamp comprising the LED package is also disclosed.

19 Claims, 5 Drawing Sheets

LIGHT EMITTING DIODE PACKAGE AND LAMP WITH THE SAME

BACKGROUND OF THE INVENTION

1. Field of the Invention

The present invention is related to a light emitting diode package and a lamp with the same, and more particularly to a light emitting diode package comprising a constant current circuit and a lamp with the same.

2. Description of the Prior Art

Having advantages of small volume, long life and low power, light emitting diodes (LED) have been widely applied for various illuminating and decorating purposes. A prior art direct current (DC) driven LED module requires a rectifying circuit or a power converter to convert an alternating current (AC) power source into a DC power source. Since a larger printed circuit board (PCB) is required for the rectifying circuit or the power converter, the DC driven LED module has a larger volume and is not suitable for a compact lamp, such as an E12 lamp base.

Another prior art AC driven LED module connects at least two LEDs in anti-parallel, and inserts a resistor between the LEDs and the AC power source. In such way, during the first half period of the AC power source, the LED with the same direction is driven, and during the second half period of the AC power source, the LED with the opposite direction is driven. As the circuit is simple compared to the DC driven LED module, the AC driven LED module has a smaller volume.

However, in order to prevent a surge from the AC power source to damage the LED, additional electronic elements such as resistors, capacitors are needed to limit the amount of current. Therefore, the volume of the AC driven LED module cannot be effectively reduced to a size suitable for a compact lamp. Also, the resistor of a high resistance causes a higher percentage of power to be dissipated into heat thereby incurring waste, and causes the luminous efficiency of the LED to be inferior because of the lower current. Moreover, since the amount of current varies with voltage, the brightness of the LED cannot be easily controlled effectively.

In summary, it is highly desirable to provide an LED module of a smaller volume and more stable current.

SUMMARY OF THE INVENTION

The present invention is directed to providing an LED package and a lamp with the same. Particularly, a light emitting diode (LED) die and a constant current circuit are arranged in the same package to reduce the volume thereof significantly. Besides, the constant current circuit may limit the maximum current applied to the LED, thereby preventing the LED from being damaged, and allowing the LED package and the lamp to be driven by a voltage source directly.

According to an embodiment, the LED package comprises a substrate, a constant current die, an LED die and an encapsulation body. The substrate has a plurality of internal conductive contacts and a plurality of external conductive contacts. The constant current die is disposed on the substrate, and is electrically connected to the internal conductive contact. The constant current die comprises a constant current circuit and a protection circuit connected in parallel with the constant current circuit, wherein the constant current circuit allows a first current to flow through and the protection circuit allows a second current, in a direction opposite to that of the first current, to flow through. The LED die is disposed on the substrate, is electrically connected to the internal conductive contact, and is in series with the constant current die. The encapsulation body encapsulates the constant current die, the LED die, and the internal conductive contacts of the substrate.

According to another embodiment, an LED lamp comprises a lamp base for electrically connected with a power source, and an aforementioned LED package.

The objective, technologies, features and advantages of the present invention will become more apparent from the following description in conjunction with the accompanying drawings, wherein certain embodiments of the present invention are set forth by way of illustration and examples.

DESCRIPTION OF THE PREFERRED EMBODIMENT

Figure 1A:
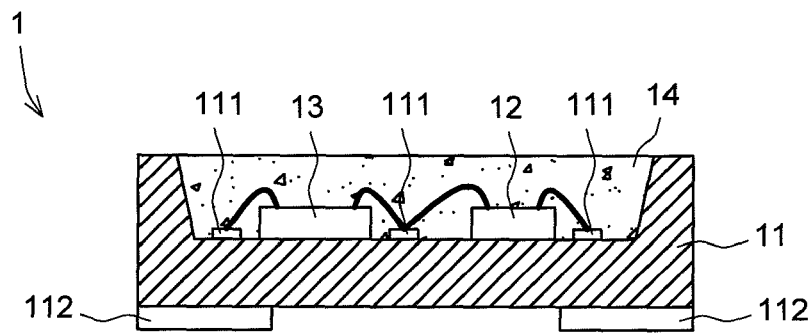
FIG. 1a is a schematic diagram illustrating the LED package according to an embodiment of the present invention.

Referring to FIG. 1a, a light emitting diode (LED) package 1 according to an embodiment comprises a substrate 11, a constant current die 12, an LED die 13, and an encapsulation body 14. The substrate 11 has a plurality of internal conductive contacts 111 and a plurality of external conductive contacts 112. In an embodiment, the substrate 11 can be a lead frame or a packaging substrate. The constant current die 12 is disposed on the substrate 11, and is electrically connected to the internal conductive contact 111 of the substrate 11, the corresponding external conductive contact 112 of which enables the constant current die 12 to electrically connect externally. The constant current die 12 can be used to limit the maximum current of the whole loop. The LED die 13 is disposed on the substrate 11, and is electrically connected to the internal conductive contact 111, the corresponding external conductive contact 112 of which enables the LED die 13 to electrically connect externally. The LED die 13 is also connected in series with the constant current die 12. The encapsulation body 14 encapsulates the constant current die 12, the LED die 13 and internal conductive contacts 111 of the substrate 11.

Figure 1B:
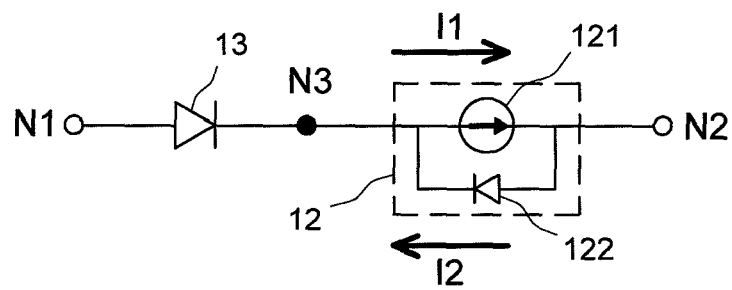
FIG. 1b is a schematic diagram illustrating the circuit of the LED package according to an embodiment of the present invention.
Figure 1C:
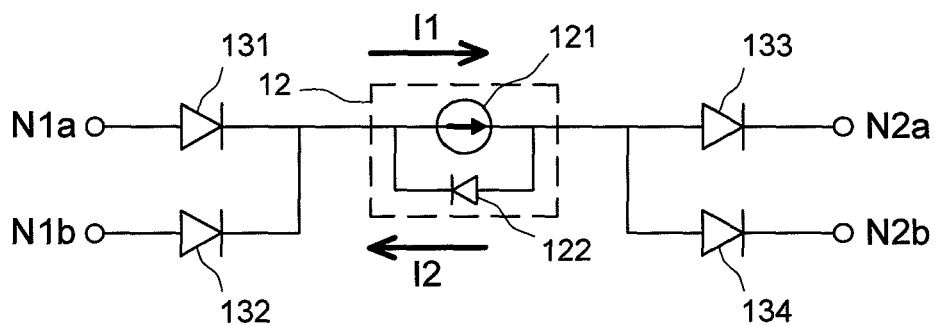
FIG. 1c is a schematic diagram illustrating the circuit of the LED package according to another embodiment of the present invention.

Referring to FIG. 1b, a constant current die 12 comprises a constant current circuit 121 and a protection circuit 122 in parallel with the constant current circuit 121. The constant current circuit 121 allows a first current I1 to flow through and the protection circuit 122 allows a second current I2, in a direction opposite to that of the first current I1, to flow through. In an embodiment, the LED die 13 in the same direction as the constant current circuit 121 is connected in series with the constant current circuit 121, thereby allowing the first current I1 to flow through. Preferably, the LED die 13 is, but not limited to be, disposed on the upstream of the constant current die 12. As shown in FIG. 1c, the LEDs 133, 134 can also be disposed on the downstream of the constant current die 12.

In an embodiment, the LED die 13 can be a single LED, a plurality of LEDs in series, or a plurality of LEDs in parallel. For example, as shown in FIG. 1c, of the LEDs 131, 132, an electrode is electrically connected at the upstream of the constant current die 12, and the other electrode is electrically connected to the internal conductive contact. Of the LEDs 133, 134, an electrode is electrically connected at the downstream of the constant current die 12, and the other electrode is electrically connected to the internal conductive contact.

Figure 3A:
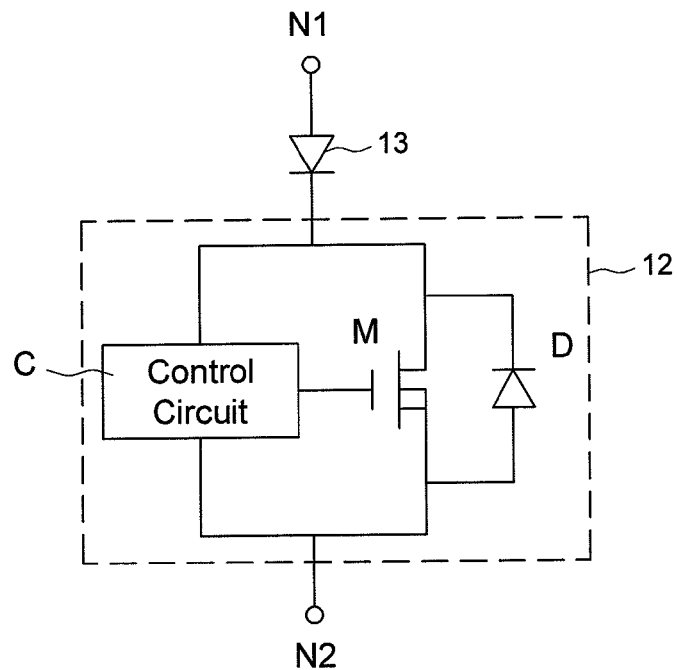
FIG. 3a is a schematic diagram illustrating the circuit of the LED package according to an embodiment of the present invention.

Referring to FIG. 3a, according to an embodiment, the constant current circuit 121 comprises a MOSFET (Metal-Oxide-Semiconductor Field-Effect Transistor) M, and a control circuit C. The control circuit C is electrically connected to the gate of the MOSFET M to control the MOSFET M to be conductive or cutoff. The body diode D of the MOSFET M, connected in parallel at the source and drain of the MOSFET M, can be the protection circuit. According to the structure, when the voltage at node N1 is greater than that at node N2, the control circuit C controls the MOSFET M to be conductive, while the body diode D is reverse-biased, which can be considered as open, so the current flows through the MOSFET M to node N2, and the LED die 13 illuminates. Because of the device characteristics of the MOSFET M, the maximum current that can flow through is limited. It is noted that other than the body diode D, the protection circuit can also be embodied as a diode, a static discharge protection element, a MOSFET or a BJT (Bipolar Junction Transistor).

Figure 3B:
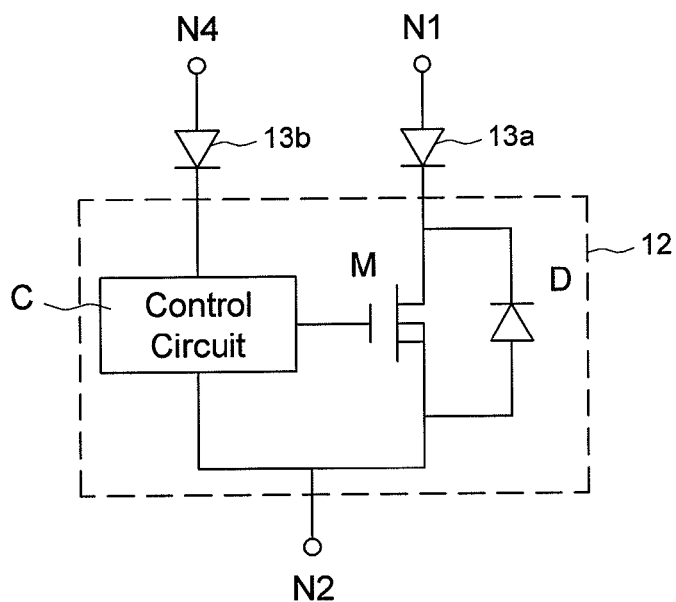
FIG. 3b is a schematic diagram illustrating the circuit of the LED package according to another embodiment of the present invention.

Referring to FIG. 3b, in an embodiment, the LED die comprises a first LED 13a and a second LED 13b. The electrodes of the first LED 13a are respectively electrically connected to the MOSFET M and the internal conductive contact of the substrate. The electrodes of the second LED 13b are respectively connected to the control circuit C and the internal conductive contact of the substrate. According to such structure, the first LED 13a can be driven by a larger current flowing from node N1 to node N2, and the second LED 13b can be driven by a smaller current flowing from node N4 to node N2. In other words, the LED package of the present invention may drive the first LED 13a and the second LED 13b of different characteristics simultaneously.

Figure 2:
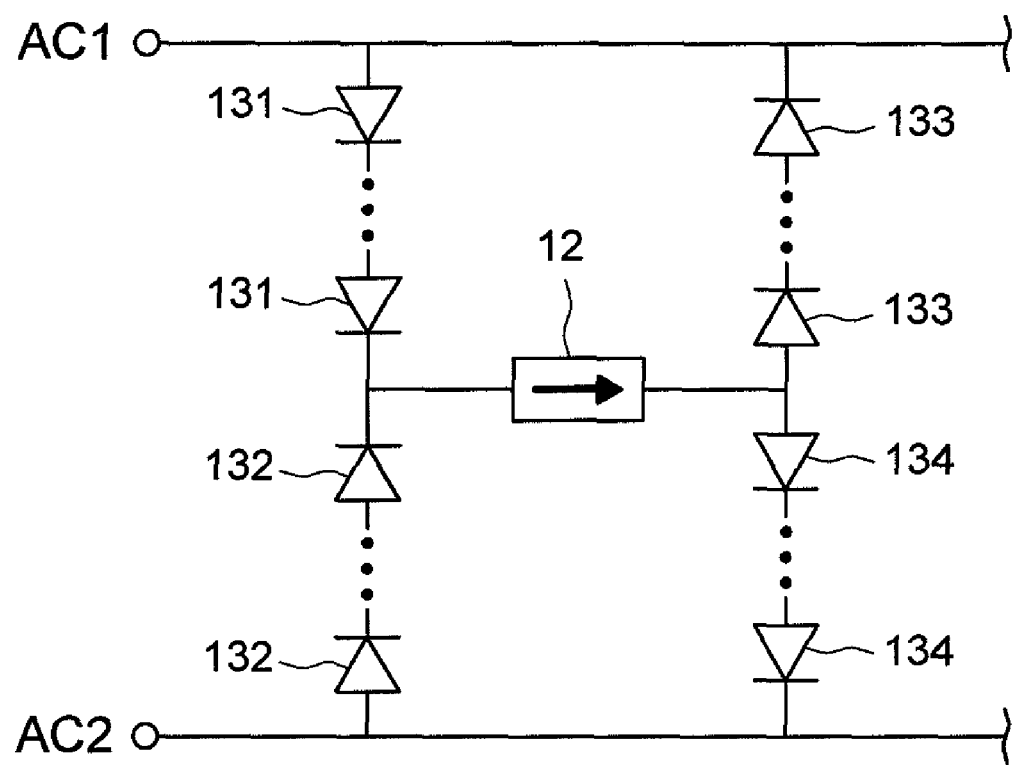
FIG. 2 is a schematic diagram illustrating an example application of the LED package according to an embodiment of the present invention.

When the LED package 1 in reference to FIG. 1b is driven by a direct current (DC) power source, i.e. when the voltage of node N1 is greater than that of node N2, the protection circuit 122 is reverse-biased and can be considered as open, the current flows through the LED die 13 and the constant current circuit 121. Since the constant current circuit 121 limits the maximum current that can flow through, the current flowing through the whole loop is controlled, thereby protecting the LED die 13. In addition, according to the embodiment shown in FIG. 1c, by connecting nodes N1a, N1b to the anode of the DC power source, and nodes N2a, N2b to the cathode of the DC power source, the LEDs 131~134 can be illuminated. Alternatively, by connecting nodes N1a, N2a to the first contact AC1 of the AC power source, nodes N1b, N2b to the second contact AC2 of the AC power source, the LEDs 131~134 are arranged in a bridge configuration, as shown in FIG. 2. In such way, during any half period of the AC power source, either the LEDs 131, 134 are illuminated or the LEDs 132, 133 are illuminated while the constant current die 12 limits the maximum current that can flow through to protect the LEDs 131~134. It is noted that the LED die 13 may comprise a plurality of series connected LEDs 131~134, as shown in FIG. 2. Moreover, the plurality of series connected LEDs 131~134 can be a single or a plurality of LED dies.

Figure 4A:
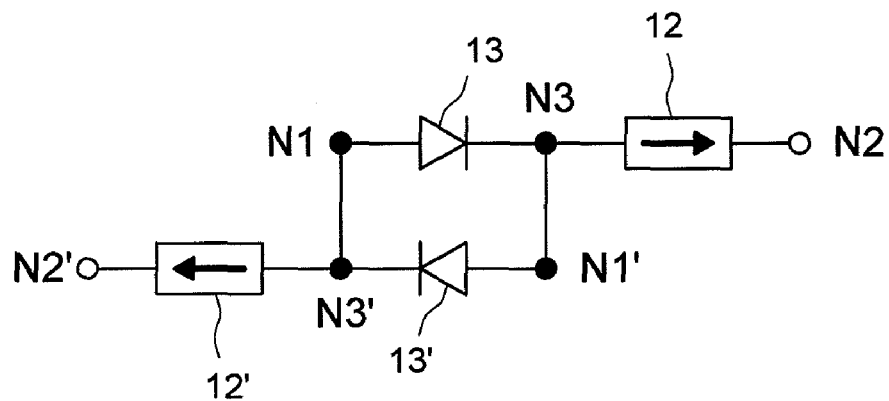
FIG. 4a and FIG. 4b are schematic diagrams illustrating the LED package being applied to the LED lamp driven by an AC power source.

It is noted that the LED package as shown in FIG. 1b can also be applied to an LED lamp driven by an AC power source. For example, by electrically connecting the node N3 between the constant current die 12 and the LED die 13 to the internal conductive contact of the substrate, the node N3 can connect electrically externally through the external conductive contact. Referring to FIG. 4a, the node N1 of the first LED package is electrically connected to the node N3' of the second LED package, and the node N1' of the second LED package is electrically connected to the node N3 of the first LED package. In such way, the LED die 13 of the first LED package is in anti-parallel with the LED die 13' of the second LED package. An LED lamp comprising the structure as shown in FIG. 4a can be driven by an AC power source. For example, when the node N2 has a positive polarity and the node N2 has a negative polarity, the current flows from the node N2, through the protection circuit of the constant current circuit 12, the LED die 13', the constant current circuit of the constant current die 12', and then back to the node N2'. Since the constant current circuit of the constant current die 12' plays a role in limiting current, the forward-biased LED die 13' is protected. When the node N2 has a negative polarity and the node N2' has a positive polarity, the current flows from the node N2' through the protection circuit of the constant current die 12', the LED die 13, the constant current circuit of the constant current die 12, and then back to the node N2. Since the constant current circuit of the constant current die 12 plays a role in limiting current, the forward-biased LED die 13 is protected. Therefore, according to the above-mentioned structure, during any half period of the AC power source, the constant current circuit of the first or the second LED package can limit the maximum current flowing through the whole loop to protect the forward-biased LED.

Figure 4B:
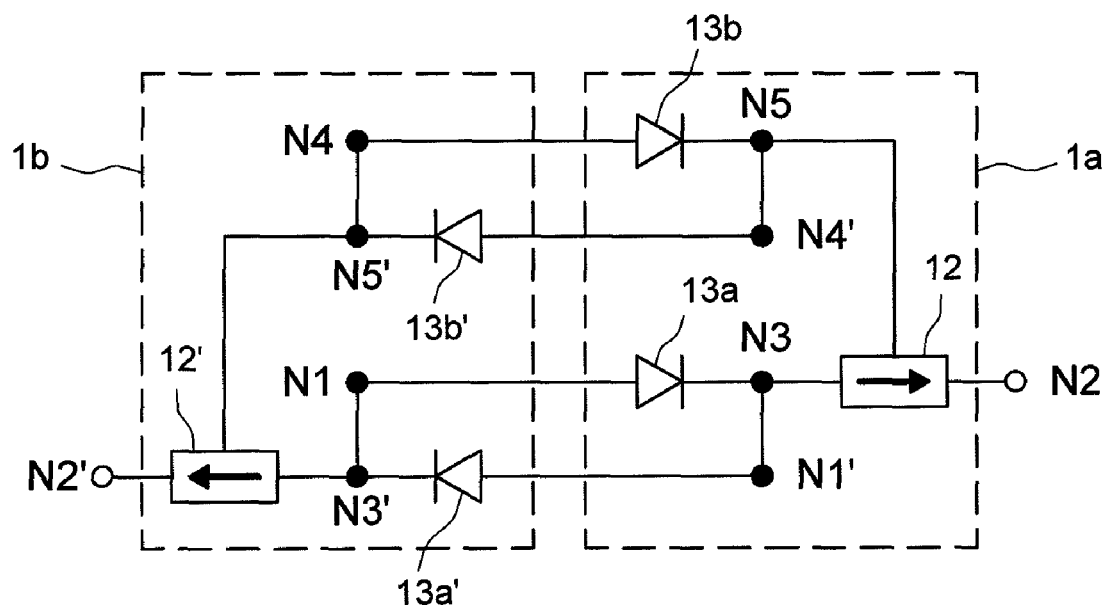

Referring to FIG. 4b and FIG. 3b, by electrically connecting a node N3 between the first LED 13a and the constant current die 12 to the internal conductive contact of the substrate, and electrically connecting a node N5 between the second LED 13b and the control circuit C to the internal conductive contact, the nodes N3, N5 can electrically connect externally through the external conductive contacts of the substrate. Similar to the configuration in FIG. 4a, by respectively connecting the nodes N1, N4 of the LED package 1a to the nodes N3', N5' of the oppositely connected LED package 1b, and respectively connecting the nodes N1', N4' of the LED package 1b to the nodes N3, N5 of the LED package 1a, the first LEDs 13a, 13a' are respectively in anti-parallel with the second LEDs 13b, 13b'. In such way, an LED lamp comprising the above-mentioned structure can be driven by an AC power source, and during any half period of the AC power source, the current limiting effect of the constant current die 12 or the constant current die 12' prevents the LEDs from being damaged.

Figure 5:
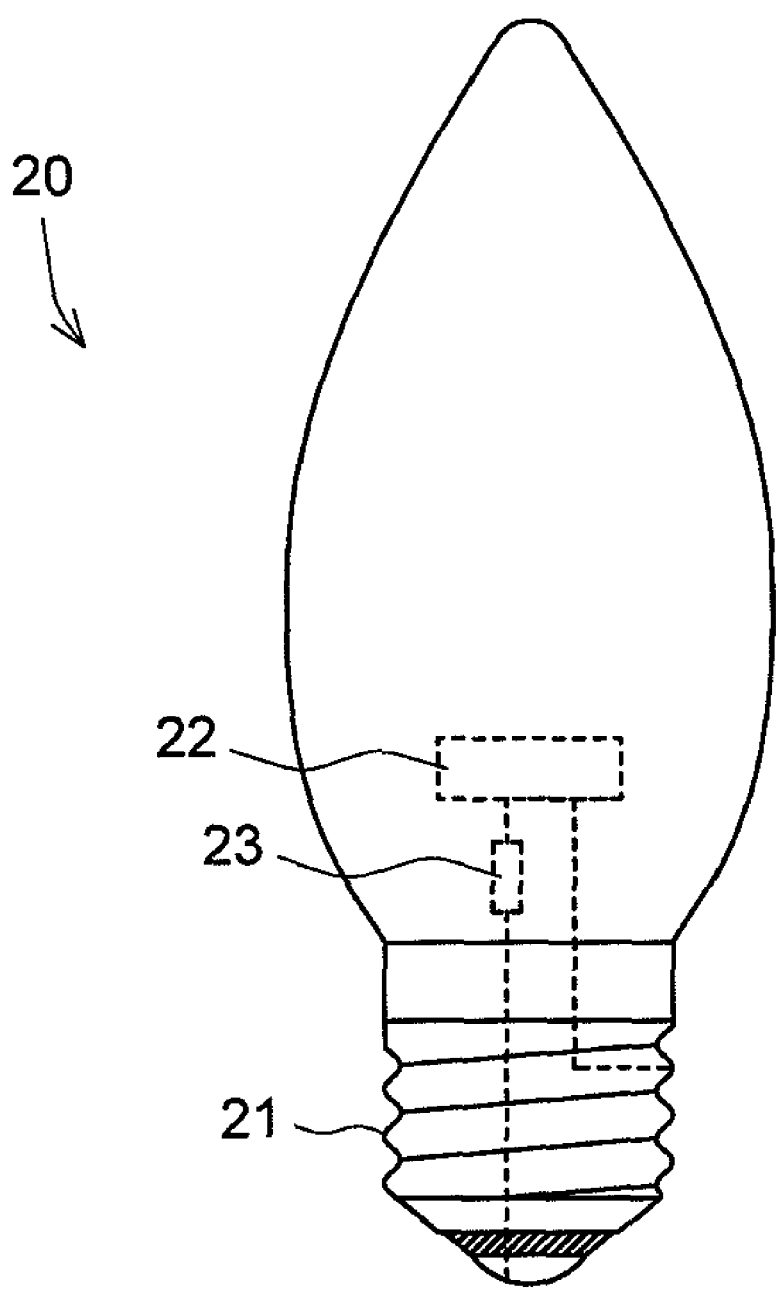
FIG. 5 is a schematic diagram illustrating the LED lamp according to an embodiment of the present invention.

Referring to FIG. 5, an LED lamp 20 according to an embodiment comprises a lamp base 21, and an LED package 22. The lamp base 21 is for connecting electrically with a DC or AC power source. For example, the lamp base 21 can be a screw-type contact or a pin-type contact. The LED package 22 is electrically connected with the lamp base 21. The description of the structure and the example application of the LED package 22 have been provided above and are therefore omitted herein. It is noted that the direction of the constant current die 12 and the LED die 13 is not limited to the embodiment shown in FIG. 1b, i.e. the diode, the protection circuit 122, is in the same direction as the LED die 13. In the LED lamp driven by the AC power source, since the whole loop comprises two oppositely connected constant current circuits 121, the diode, the protection circuit 122, in the same direction as the LED die 13 can also be applied in the LED package of the present invention.

According to an embodiment, the LED lamp further comprises a fuse 23 disposed between the lamp base 21 and the LED package 22. The fuse 23 provides further protection for the LED package 22 from the LED die being damaged.

In conclusion, the LED package of the present invention and the lamp with the same arrange an LED die and a constant current circuit in the same package, and therefore the volume thereof can be significantly reduced to a size suitable for a compact lamp, such as an E12 lamp base. Also, the maximum current applied to the LED is limited by the constant current circuit, thereby preventing the LED from being damaged. In addition, the LED package of the present invention can be applied in an LED lamp driven by an AC power source through the connection of a simple circuit.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A light emitting diode (LED) package comprising:
   a substrate having a plurality of internal conductive contacts and a plurality of external conductive contacts;
   a constant current die disposed on the substrate, electrically connected to the internal conductive contact, and comprising:
      a constant current circuit allowing a first current to flow through; and
      a protection circuit in parallel with the constant current circuit, and allowing a second current to flow through, wherein the current direction of the first current and the second current are opposite;
   an LED die disposed on the substrate, electrically connected to the internal conductive contact and in series with the constant current die; and
   an encapsulation body encapsulating the constant current die, the LED die and the internal conductive contacts.

2. The LED package according to claim 1, wherein the LED die allows the first current to flow through and is disposed on the upstream of the constant current die.

3. The LED package according to claim 1, wherein the node between the constant current die and the LED die is electrically connected to the internal conductive contact.

4. The LED package according to claim 1, wherein the protection circuit comprises a diode, a static discharge protection element, a MOSFET or a BJT (Bipolar Junction Transistor).

5. The LED package according to claim 1, wherein the substrate comprises a lead frame or a packaging substrate.

6. The LED package according to claim 1, wherein the LED die comprises a plurality of LEDs in series or in parallel.

7. The LED package according to claim 1, wherein the constant current circuit comprises a MOSFET (Metal-Oxide-Semiconductor Field-Effect Transistor) and a control circuit, wherein the control circuit is electrically connected to the gate of the MOSFET, for controlling the MOSFET being conducting or cutoff; the protection circuit comprises the body diode of the MOSFET.

8. The LED package according to claim 7, wherein the LED die comprises a first LED and a second LED, wherein the first LED is serially connected between the MOSFET and the internal conductive contact, and the second LED is serially connected between the control circuit and the internal conductive contact.

9. The LED package according to claim 8, wherein a node between the first LED and the MOSFET is electrically connected to the internal conductive contact; a node between the second LED and the control circuit is electrically connected to the internal conductive contact.

10. An LED lamp comprises:
    a lamp base for electrically connected with a power source; and
    an LED package electrically connected with the lamp base, and comprising:
       a substrate having a plurality of internal conductive contacts and a plurality of external conductive contacts;
       a constant current die disposed on the substrate, electrically connected to the internal conductive contact, and comprising:
          a constant current circuit allowing a first current to flow through; and
          a protection circuit in parallel with the constant current circuit, and allowing a second current to flow through, wherein the current direction of the first current and the second current are opposite;
       an LED die disposed on the substrate, electrically connected to the internal conductive contact and in series with the constant current die; and
       an encapsulation body encapsulating the constant current die, the LED die and the internal conductive contacts.

11. The LED lamp according to claim 10, wherein the LED die allows the first current to flow through and is disposed on the upstream of the constant current die.

12. The LED lamp according to claim 10, wherein the protection circuit comprises a diode, a static discharge protection element, a MOSFET or a BJT (Bipolar Junction Transistor).

13. The LED lamp according to claim 10, wherein the substrate comprises a lead frame or a packaging substrate.

14. The LED lamp according to claim 10, wherein the LED die comprises a plurality of LEDs in series or in parallel.

15. The LED lamp according to claim 10, further comprises a fuse disposed between the light base and the LED package.

16. The LED lamp according to claim 10, wherein the constant current circuit comprises a MOSFET (Metal-Oxide-Semiconductor Field-Effect Transistor) and a control circuit, wherein the control circuit is electrically connected to the gate of the MOSFET, for controlling the MOSFET being conducting or cutoff; the protection circuit comprises the body diode of the MOSFET.

17. The LED lamp according to claim 16, wherein the LED die comprises a first LED and a second LED, wherein the first LED is serially connected between the MOSFET and the internal conductive contact, and the second LED is serially connected between the control circuit and the internal conductive contact.

18. The LED lamp according to claim 10, wherein the node between the constant current die and the LED die is electrically connected to the internal conductive contact.

19. The LED lamp according to claim 18 comprising two of the LED packages, and the LED die of one of the LED package is electrically connected to the node between the constant current die and the LED die of another of the LED package, for arranging the LED die of the plurality of LED packages to be in anti-parallel.

* * * * *